(12) United States Patent
Graas et al.

(10) Patent No.: US 10,996,259 B2
(45) Date of Patent: May 4, 2021

(54) OPTIMIZATION OF INTEGRATED CIRCUIT RELIABILITY

(71) Applicant: INTERNATIONAL BUSINESS MACHINES CORPORATION, Armonk, NY (US)

(72) Inventors: Carole D. Graas, Jericho, VT (US); Nazmul Habib, South Burlington, VT (US); Deborah M. Massey, Jericho, VT (US); John G. Massey, Chittenden, VT (US); Pascal A. Nsame, Essex Junction, VT (US); Ernest Y. Wu, Essex Junction, VT (US); Emmanuel Yashchin, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/733,573

(22) Filed: Jan. 3, 2020

(65) Prior Publication Data

US 2020/0141996 A1 May 7, 2020

Related U.S. Application Data

(63) Continuation of application No. 15/630,415, filed on Jun. 22, 2017, now Pat. No. 10,564,214, which is a
(Continued)

(51) Int. Cl.
*G06F 30/30* (2020.01)
*G01R 31/26* (2020.01)
(Continued)

(52) U.S. Cl.
CPC ......... *G01R 31/26* (2013.01); *G01R 31/2856* (2013.01); *G01R 31/50* (2020.01)

(58) Field of Classification Search
CPC ..... G01R 31/26; G01R 31/50; G01R 31/2856
(Continued)

(56) References Cited

U.S. PATENT DOCUMENTS 5,822,218 A * 10/1998 Moosa ............. G01R 31/31835
716/52
6,538,462 B1 * 3/2003 Lagowski ............... H01L 22/14
257/E21.531
(Continued)

FOREIGN PATENT DOCUMENTS

JP 2004040040 2/2004
JP 2004200581 7/2004
(Continued)

OTHER PUBLICATIONS

Srivastava, et al., "Analysis of double-gate CMOS for double-pole four-throw RF switch desgin at 45-nm technology", Journal of Comput Electron (2011), Springer Science+business Media LLC 2011, Published online Apr. 19, 2011, pp. 229-240, DOI 10.1007/s10825-011-0359-6.
(Continued)

*Primary Examiner* — Jack Chiang
*Assistant Examiner* — Brandon Bowers
(74) *Attorney, Agent, or Firm* — Steven Meyers; Andrew M. Calderon; Roberts Calderon Safran & Cole, P.C.

(57) ABSTRACT

A per-chip equivalent oxide thickness (EOT) circuit sensor resides in an integrated circuit. The per-chip EOT circuit sensor determines electrical characteristics of the integrated circuit. The measured electrical characteristics include leakage current. The determined electrical characteristics are used to determine physical attributes of the integrated circuit. The physical attributes, including EOT, are used in a reliability model to predict per-chip failure rate.

17 Claims, 4 Drawing Sheets

Related U.S. Application Data continuation of application No. 15/155,518, filed on May 16, 2016, now Pat. No. 9,739,824, which is a continuation of application No. 14/064,337, filed on Oct. 28, 2013, now Pat. No. 9,395,403.

(51) Int. Cl.
  *G01R 31/28* (2006.01)
  *G01R 31/50* (2020.01)

(58) Field of Classification Search
  USPC .......................................................... 716/132
  See application file for complete search history.

(56) References Cited

U.S. PATENT DOCUMENTS

| | | | |
|---|---|---|---|
| 8,112,241 B2* | 2/2012 | Xiong | G01N 21/9501 |
| | | | 702/117 |
| 8,127,157 B2 | 2/2012 | Bilak | |
| 8,161,431 B2 | 4/2012 | Buonpane et al. | |
| 8,201,038 B2 | 6/2012 | Graas et al. | |
| 8,421,481 B2 | 4/2013 | Kumar et al. | |
| 2002/0090746 A1* | 7/2002 | Xu | G01N 27/60 |
| | | | 438/17 |
| 2006/0080062 A1 | 4/2006 | Bose et al. | |
| 2007/0018674 A1* | 1/2007 | Cho | G01R 31/312 |
| | | | 324/754.03 |
| 2007/0069759 A1* | 3/2007 | Rzepiela | G01R 31/2831 |
| | | | 324/762.05 |
| 2008/0058978 A1* | 3/2008 | Cain | G06F 30/20 |
| | | | 700/121 |
| 2009/0206821 A1 | 8/2009 | Meterelliyoz et al. | |
| 2010/0161304 A1 | 6/2010 | Voldman | |
| 2011/0006794 A1* | 1/2011 | Sellathamby | G01R 31/3025 |
| | | | 324/754.03 |
| 2011/0031981 A1 | 2/2011 | Tsujikawa | |
| 2011/0078506 A1 | 3/2011 | Graas et al. | |
| 2012/0191384 A1 | 7/2012 | Kalgren et al. | |

FOREIGN PATENT DOCUMENTS

| | | |
|---|---|---|
| JP | 2005108918 | 4/2005 |
| JP | 2010170470 | 8/2010 |
| WO | 2012012850 | 2/2012 |

OTHER PUBLICATIONS

Yang, et al., "Very High Density RF MIM Capacitors (17fF/lum/sup 2/) Using High-/spl kappa/ Al/sub 2/O3 Doped Ta/sub 2/O/sub 5/ Dielectrics", IEEE Microwave and Wireless Components Letters, vol. 13, No. 10, Oct. 2003, pp. 431-433, Copyright 2003 IEEE.

Yang, et al., "Modeling Study of Ultrathin Gate Oxides Direct Tunneling Current and Capacitance-Voltage Measurements in MOS Devices", IEEE Transactions on Electron Devices, vol. 46, No. 7, Jul. 1999, pp. 1464-1471, Publisher Item Identifier S 0018-9383(99)05091-1, Copyright 1999 IEEE.

Zhao, et al., "Predictive Technology Model for Nano—CMOS Design Exploration", Arizona State University, ACM Journal on Emerging Technologies in Computing Systems, vol. 3, No. 1, Article 1, Apr. 2007, pp. 1-17, DOI 10.1145/1229175.1229176, <http://doi.acm.org/10.1145/1229175.1229176>, Copyright 2007 ACM.

Office Action dated Jun. 25, 2020 in related Application No. 15/814,658, 16 pages.

Notice of Allowance dated Dec. 23, 2020 in related U.S. Appl. No. 15/814,658, 8 pages.

Office Action dated Nov. 30, 2020 in related U.S. Appl. No. 16/676,635, 9 pages.

* cited by examiner

OPTIMIZATION OF INTEGRATED CIRCUIT RELIABILITY

FIELD OF THE INVENTION

The present invention relates generally to the field of integrated circuits, and more particularly to predicting the reliability of integrated circuits.

BACKGROUND OF THE INVENTION

Integrated circuits are found in a wide variety of equipment, including household appliances, consumer electronics, communications systems, automotive systems, aircraft, and the like. As dependence on integrated circuits has increased, the reliability of these devices has increasingly become an important concern. In general, as devices scale to smaller silicon fabrication technologies, they often become less reliable for the same use conditions.

There are many failure mechanisms that affect the reliability of an integrated circuit. Several of these mechanisms are influenced by the gate oxide thickness of the integrated circuit, for example, Bias Temperature Instability (BTI) and Time Dependent Dielectric Breakdown (TDDB). Bias Temperature Instability can be either negative or positive, and relates to the change in threshold voltage and drain current with a change in gate oxide thickness of a metal-oxide-semiconductor field-effect transistor (MOSFET) in an integrated circuit. Time Dependent Dielectric Breakdown is a failure mechanism in MOSFETs, when the gate oxide breaks down as a result of long-time application of relatively low electric field. The breakdown is caused by formation of a conducting path through the gate oxide to the substrate due to electron tunneling current, when MOSFETs are operated close to or beyond their specified operating voltages. Reliability models that rely on equivalent oxide thickness (EOT) based on a small sampling of production wafer kerf structures do not account for the inherent process variability in the deposition of the gate oxide layer across the wafer.

SUMMARY

Embodiments of the present invention disclose a method, computer program product, and structure for optimizing reliability of integrated circuits. Several integrated circuit failure mechanisms depend on the thickness of the gate oxide. An equivalent oxide thickness (EOT) is a distance, usually given in nanometers, which indicates how thick a silicon oxide film would need to be to produce the same effect as the high-k (or high dielectric constant) material being used. If the EOT is low, or as the oxide thickness degrades with use of the integrated circuit, reliability may be negatively impacted. In an embodiment of the present invention, a per-chip equivalent oxide thickness (EOT) circuit sensor resides in an integrated circuit. The per-chip EOT circuit sensor determines electrical characteristics of the integrated circuit. Specifically, the per-chip EOT circuit sensor detects leakage current that occurs when a set voltage is applied through the integrated circuit gate. The determined electrical characteristics are used to determine physical attributes of the integrated circuit. The detected leakage current is inserted into an industry-standard algorithm, known as quantum mechanical direct tunneling current density as a function of dielectric thickness at a fixed applied voltage, to calculate the per-chip EOT. The calculated EOT may be used in a plurality of reliability models to predict the reliability of the chip for which the EOT was measured. The reliability modeling is optimized per-chip and that chip may be placed in a suitable application.

DETAILED DESCRIPTION

Figure 1:
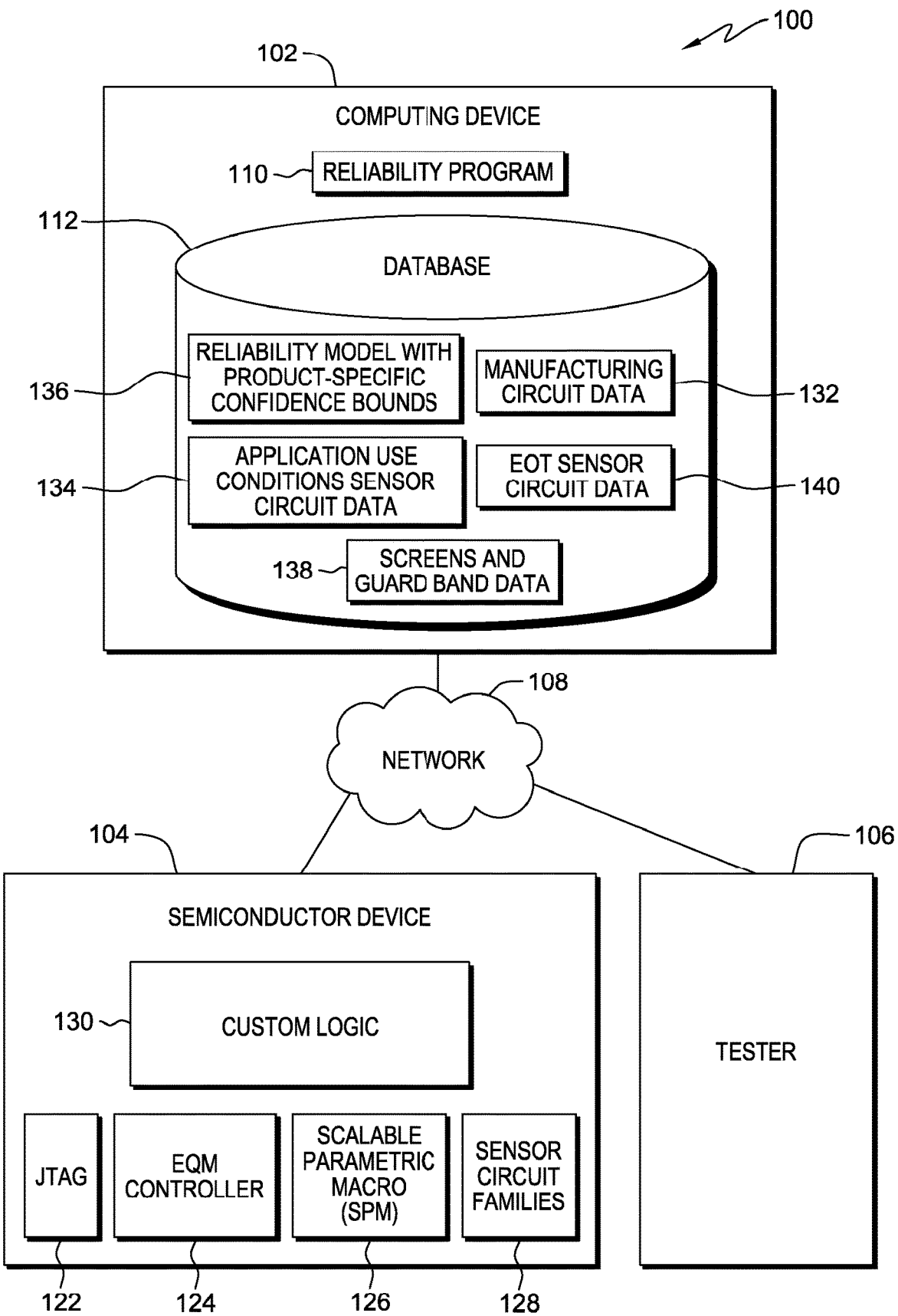
FIG. 1 is a functional block diagram illustrating a semiconductor testing environment, in accordance with an embodiment of the present invention.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

For a given application condition, there is a growing gap between the expected reliability targets of semiconductor products and the specified functionality of integrated circuits at nanometer technology nodes. In order to address these concerns, the embodiments herein provide a structure, computer program product and method to efficiently utilize design for reliability technology in integrated circuits by means of a standardized on-product service processor macro structure. The embodiments herein utilize a memory mapped address to interface with application function in mission mode; store stimulus and signatures; integrate quality and reliability sensors; integrate various embedded analog and digital cores; execute test programs and test patterns; and utilize joint test action group (JTAG) and network input/output (I/O) connections.

Reliability is a design engineering discipline that applies scientific knowledge to assure a product will perform its intended function for the required duration within a given environment. This includes designing in the ability to maintain, test, and support the product throughout its total life cycle. Limitations of this discipline include high failure in time (FIT) rates; lengthy reliability evaluation; reliability engineering (RE) bridging scalability; defect detractors; and power and thermal control issues. The design and methodology presented herein, with enhanced-circuit limited reliability (CLR), utilizes Virtual Qualification Platform (VQP); Embedded Quality Management (eQM); On-line Global Reliability Model (OGRM); Embedded Reliability Engineering (RE) Evaluation; and Dynamic Product Grading (DPG).

Qualification testing of new integrated circuit technology consists of exposing a number of integrated circuits to accelerated environmental tests that simulate field conditions in order to verify the reliability of the new technology. Currently, reliability modeling for integrated circuits, also referred to as chips, is largely based on qualification testing results of relatively small sample sizes. Variability of aspects of the manufacturing processes over the life of the product may not be taken into account in the modeling since the small sample size used in the qualification testing may not be representative of day to day variations that take place in manufacturing processes. Several integrated circuit failure mechanisms are dependent upon the gate oxide thickness. As is known to one skilled in the art, the gate oxide is the dielectric layer that separates the gate terminal of a MOSFET from the underlying source and drain terminals as well as the conductive channel that connects source and drain when the transistor is turned on. Gate oxide is formed by oxidizing the silicon of the channel to form a thin insulating layer of silicon dioxide. A conductive gate material is subsequently deposited over the gate oxide to form the transistor. Reliability predictions are made using the equivalent oxide thickness (EOT). An equivalent oxide thickness is a distance, usually given in nanometers, which indicates how thick a silicon oxide film would need to be to produce the same effect as the high-k (or high dielectric constant) material being used. If the equivalent oxide thickness is low, or as the oxide thickness degrades with use of the integrated circuit, reliability may be negatively impacted. As known to one skilled in the art, wafer kerf structures are non-functional areas of the wafer, outside of the active integrated circuits. The equivalent oxide thicknesses used in reliability predictions are calculated from device qualification test results and limited measurements from production wafer kerf structures.

Embodiments of the present invention recognize the value of predicting reliability per chip as a way to determine the optimum operating conditions per product. Embodiments of the present invention enable EOT measurements per chip, with one or more sensors per chip, each sensor detecting one EOT measurement, which can significantly reduce the variability of the reliability prediction and optimize the modeling. The ability to characterize the reliability of each chip enables sorting of the chips by estimated field life. The most reliable chips may be installed in specific, high reliability systems to avoid system downtime and to avoid unnecessary component replacement in the field. Implementation of embodiments of the invention may take a variety of forms, and exemplary implementation details are discussed subsequently with reference to the Figures.

The present invention will now be described in detail with reference to the Figures. FIG. 1 is a functional block diagram illustrating a semiconductor testing environment, generally designated 100, in accordance with one embodiment of the present invention. FIG. 1 provides only an illustration of one implementation and does not imply any limitations with regard to the various environments in which different embodiments may be implemented. Many modifications to the depicted environment may be made. In the illustrated embodiment, semiconductor testing environment 100 includes computing device 102, semiconductor device 104 and tester 106 interconnected via network 108. Semiconductor device 104 may also be directly interconnected to tester 106.

Reliability modeling for integrated circuits is performed in one or more of several different methods. In the preferred embodiment of the present invention, technology-specific sensors for measuring physical oxide thickness of the silicon active area, in addition to environmental chip-specific sensors for measuring power-on-hours, temperature, activity factors and voltage are integrated into the design of each chip on a wafer. An external tester applies a set of test controls and test conditions across all the devices on the integrated circuit. The applied voltage causes a leakage current through the gate. Leakage current is a gradual loss of energy from a charged capacitor. It is primarily caused by electronic devices attached to the capacitors, such as transistors or diodes, which conduct a small amount of current even when they are turned off. Even though this off current is an order of magnitude less than the current through the device when it is on, the current still slowly discharges the capacitor. Another contributor to leakage from a capacitor is from the undesired imperfection of some dielectric materials used in capacitors, also known as dielectric leakage. Dielectric leakage is a result of the dielectric material not being a perfect insulator and having some non-zero conductivity, allowing a leakage current to flow, slowly discharging the capacitor. The tester interfaces with the integrated sensors and uses technology-specific equivalent oxide thickness (EOT) sensors to measure and characterize tunneling current density by device type as a function of physical oxide thickness. The tester interacts with the integrated technology-specific sensors via a Joint Test Action Group (JTAG) interface connected to a scalable parametric macro (SPM) which drives the control, data and power signals required to independently isolate and/or operate the integrated technology-specific sensors. A reliability program residing on an external computing device, or on a device such as an embedded quality management (EQM) controller or on a tester, such as tester 106, inserts the measured technology-specific EOT into a product-specific algorithm for calculation of the failure rate of the integrated circuit that was tested. The reliability program inserts the EOT into one or more reliability models that predict integrated circuit reliability based on the per-chip EOT, the manufacturing defect density, the test screens and the application conditions. In general, the lower the EOT, the higher the failure rate prediction is for the integrated circuit, depending on the failure mechanism. Optimization of reliability modeling is achieved by using per-chip EOT measurements to predict product life for individual integrated circuits including static random access memory (SRAM), embedded dynamic random access memory (EDRAM), ternary content addressable memory (TCAM), non-volatile random access memory (NVRAM), read only memory (ROM), electrically erasable programmable read only memory (EEPROM), cores, digital logic, and analog devices, instead of relying on EOT measurements made on a small sample of qualification hardware or kerf structures that are not typically representative of the active silicon area of the manufactured circuit design for each chip on a wafer.

In various embodiments of the present invention, computing device 102 is a computing device that can be a stand-alone device, a server, a laptop computer, a tablet computer, a netbook computer, a personal computer (PC), or a desktop computer. In another embodiment, computing device 102 represents a computing system utilizing clustered computers and components to act as a single pool of seamless resources. In general, computing device 102 can be any computing device or a combination of devices with access to reliability program 110, database 112, semiconductor device 104, and tester 106, and is capable of executing reliability program 110. Computing device 102 may include internal and external hardware components, as depicted and described in further detail with respect to FIG. 4.

Network 108 can be, for example, a local area network (LAN), a wide area network (WAN) such as the Internet, or a combination of the two, and can include wired, wireless, or fiber optic connections. In general, network 108 can be any combination of connections and protocols that will support communications between computing device 102, semiconductor device 104 and tester 106.

Reliability program 110 resides on computing device 102. In another embodiment, reliability program 110 may reside on tester 106. In yet another embodiment, reliability program 110 may reside in EQM controller 124. Reliability program 110 draws data from database 112 to calculate the predicted reliability of semiconductor device 104. According to an illustrative embodiment, reliability program 110 uses electrical characteristics detected by semiconductor device 104 to calculate physical characteristics, for example, gate oxide thickness. Failure rate modeling of semiconductor device 104 uses the calculated gate oxide thickness to predict the reliability of semiconductor device 104. One implementation of reliability program 110 is described in further detail with respect to FIG. 3.

Database 112 resides on computing device 102. In another embodiment, database 112 may reside on tester 106. In yet another embodiment database 112 may reside in EQM controller 124. Database 112 stores the data that is used, by reliability program 110, to model the reliability of semiconductor device 104. Examples of data stored in database 112 include equivalent oxide thickness (EOT) sensor circuit data 140, manufacturing circuit data 132, application use conditions sensor circuit data 134, as well as reliability model with product-specific confidence bounds 136. EOT sensor circuit data 140 is leakage current data that was described above. EOT sensor circuit data 140 is used to calculate the oxide thickness value that is used in reliability modeling. Manufacturing circuit data 132 may include process variability data and/or defect density data collected during the fabrication of the semiconductor device. Manufacturing circuit data 132 is used to adapt the reliability model with real-time, per-chip data. Application use conditions sensor circuit data 134 describes the environmental conditions that a semiconductor device may be subjected to over the life of the device. Examples of application use conditions sensor circuit data include system ambient temperature and power on hours. Reliability model with product-specific confidence bounds 136 includes a plurality of algorithms for calculating estimated failure rate, including algorithms for calculating early life failure rate and intrinsic failure rate, based on the per-chip EOT measurements. Database 112 may also include screens and guard band data 138 that is used to generate test limits for use by tester 106. Screens and guard band data 138 may include data from a 3D part average test. Requirements for screens and guard band data 138 may be generated by translating the quality and reliability requirements of the semiconductor device into test criteria.

Semiconductor device 104 includes a plurality of components. For test purposes, a component for boundary scan test known as JTAG (Joint Test Action Group) 122 is included. JTAG 122 may include a self-test function known as a built-in self test (BIST). In the present embodiment, JTAG 122 interacts with Tester 106. Semiconductor device 104 also includes an embedded quality management component referred to as EQM controller 124. EQM controller 124 includes many different forms of interfaces, including control interface, JTAG interface, sensor interface, etc. In certain embodiments, EQM controller 124 includes a centralized programming interface and takes measurements, calculates EOT and adapts the reliability prediction for semiconductor device 104. In such a case, reliability program 110 and database 112 are contained within semiconductor device 104, and computing device 102 is not required in the semiconductor testing environment.

In a first embodiment, semiconductor device 104 also includes scalable parametric macro (SPM) 126. SPM 126 provides power supplies, control signals, input and output signals to a family of circuit sensors (i.e. EOT, Temperature, Voltage, Power-on-Hours, etc.). SPM 126 also serves as the interface to tester 106 and to EQM controller 124 during per-chip circuit measurements and processing of the confidence bounds of the application-specific reliability model updates. Custom logic 130 performs the intended function of the chip. For example, if the chip is an application specific integrated circuit (ASIC), custom logic 130 performs the function for which the chip is designed. If, for example, the chip is designed to run a digital voice recorder or to control the functions of an automobile, then custom logic 130 performs those functions.

In a first embodiment, SPM 126 is connected to a network of EOT sensor families, referred to as sensor circuit families 128. Sensor circuit families 128 reside in strategically designed areas of the silicon occupied by custom logic 130 to provide sufficient spatial coverage to minimize on-chip variability.

In a first embodiment, sensor circuit families 128 include a family of transistors with equivalent RLC (resistance, inductance, capacitance) models, a programmable network unit, and a programmable voltage regulation unit configured to measure a family of reliability model parameters as a function of component functional operating performance. Sensor circuit families 128 detect leakage current through the integrated circuit gate. Leakage refers to a gradual loss of energy from a charged capacitor. Typically, a large area planar capacitor, bounded either by shallow trench isolation (STI) or diffusion, is used for this measurement because the average coverage over the planar surface area enables good leakage measurements that are dependent on average oxide thickness and are not as affected by random variations. Reliability program 110 calculates the equivalent gate oxide thickness by inserting the detected leakage current value into an industry standard formula for oxide thickness. In general, such a calculation takes into account the detected leakage current and the area over which the leakage current was measured, as well as several coefficients specific to the technology being tested, as known to one skilled in the art.

In a first embodiment, tester 106 is an apparatus used to test integrated circuits, for example, a wafer prober. In general, wafer probers test for certain static faults in semiconductor devices, caused mainly by manufacturing problems, for example, shorts, opens, and logic errors. Tester 106 applies a voltage to sensor circuit families 128 to detect a resultant current. In one embodiment, tester 106 provides the electrical measurements used by reliability program 110 to calculate reliability predictions for semiconductor device 104. In another embodiment, tester 106 interfaces with JTAG 122 on semiconductor device 104 to provide the electrical measurements used by EQM controller 124 to calculate reliability predictions for semiconductor device 104.

Figure 2:
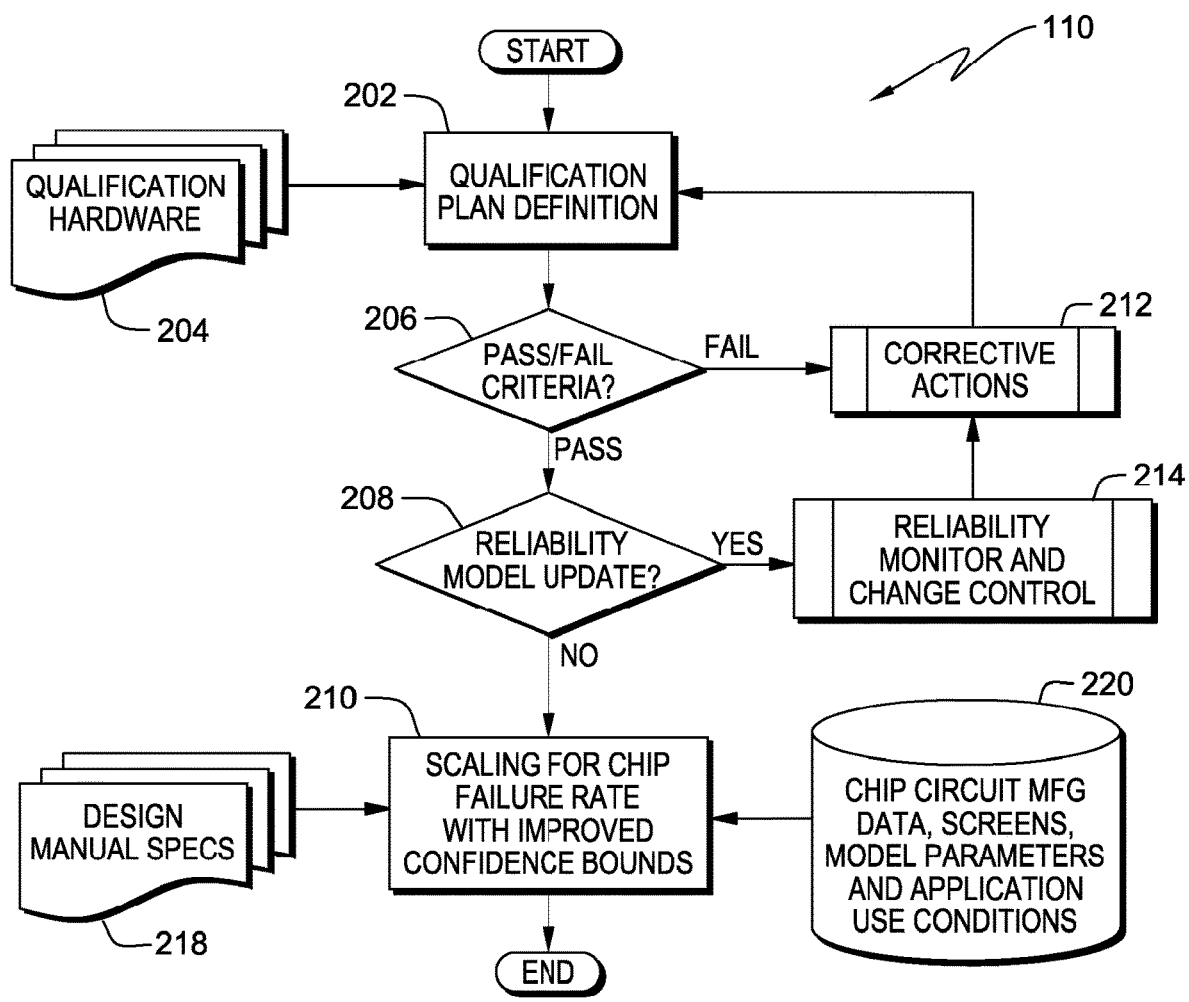
FIG. 2 is a flow diagram illustrating a qualification process for a new integrated circuit technology and/or product, in accordance with an embodiment of the present invention.

FIG. 2 is a flow diagram illustrating an integrated process for assessing the reliability of a semiconductor device with improved product-specific confidence bounds. The qualification plan defines the circuits, tests and pass/fail criteria required to meet the qualification objectives of a technology and/or product (step 202). The qualification plan includes a list of required hardware, i.e. integrated circuit chips (block 204), along with defined tests that the hardware is to be subjected, and pass/fail criteria. An example of a qualification test is accelerated thermal cycling, where the chip is subjected to cycles of high and low temperatures and tested at specified intervals to determine whether the chip is still functional. Subsequent to qualification testing, test data is reviewed to determine whether the test hardware passed or failed the defined test criteria (decision block 206).

If the test hardware fails the defined test criteria (fail branch, decision block 206), failures are analyzed for root cause, and corrective actions are implemented (step 212). For example, if a failure is determined to be the result of a manufacturing defect, improved process features and/or controls may be implemented to prevent the defect from re-occurring. If the corrective actions are significant in terms of the affect on the integrated circuit reliability, the qualification plan may be updated to include a re-population of one or more tests of improved hardware.

If the test hardware passes the defined test criteria (pass branch, decision block 206), the reliability models are reviewed to determine whether the test hardware, and the current and future manufacturing processes are consistent with the expectations for the production hardware. Subsequent to the test hardware passing the defined test criteria, the reliability models may require updating (decision block 208). If the reliability models require updating (yes branch, decision block 208), the circuit and/or manufacturing process updates under change control may be validated using a reliability monitor (step 214).

If the reliability models do not require updating (no branch, decision block 208), the production readiness phase begins, and reliability program 110, which enables scaling for chip failure rate with improved confidence bounds, is executed (step 210). Scaling is a method of mapping the failure rate of applications relative to a baseline failure rate prediction for a reference technology or size. Inputs to the scaling for chip failure rate include design manual specifications (block 218) and data from database 112, including chip circuit manufacturing data, screens and guard band data, application use conditions, model parameters and chip-specific EOT sensor circuit data (block 220).

Figure 3:
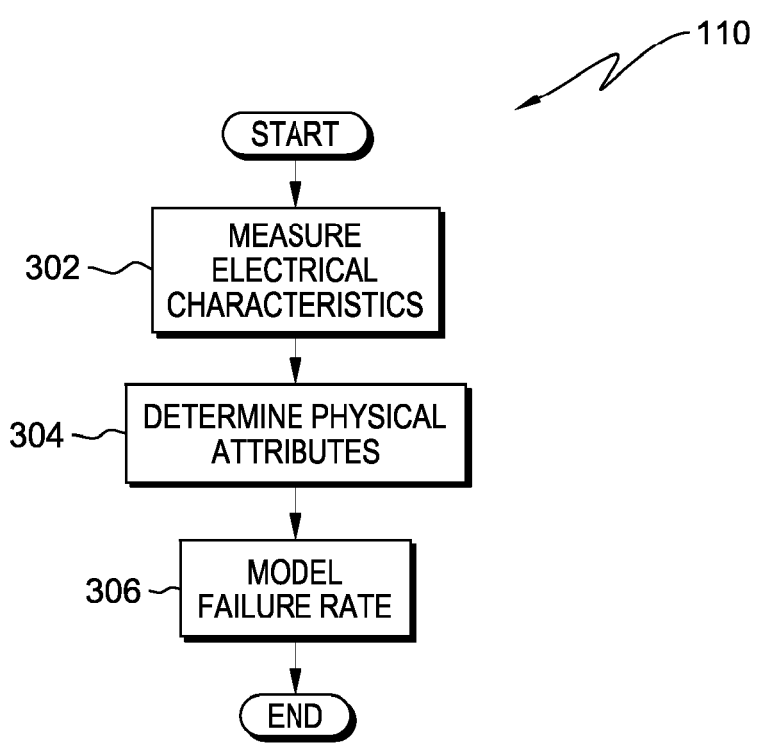
FIG. 3 is a flowchart depicting operational steps of a reliability program, on a computing device within the semiconductor testing environment of FIG. 1, for predicting per chip reliability, in accordance with an embodiment of the present invention.

FIG. 3 is a flowchart depicting operational steps of reliability program 110 residing on computing device 102, in accordance with an embodiment of the present invention. As will be appreciated by one skilled in the art, the reliability of an integrated circuit depends on the timing of the occurrence of various failure mechanisms in the life of the integrated circuit. There are many reliability models for failure mechanisms of integrated circuits. Several models depend on the gate oxide thickness for prediction of reliability. Examples of failure mechanism models that depend on the gate oxide thickness are Bias Temperature Instability (BTI), Time Dependent Dielectric Breakdown (TDDB) and frequency degradation. The gate oxide thickness may be obtained by means of a leakage current measurement. By obtaining gate oxide thickness by means of measuring leakage current per each individual semiconductor device, the reliability modeling is optimized because the model is specific to the semiconductor device being tested instead of a general model based on a small sample of qualification devices and/or limited measurements from production wafer kerf structures.

Reliability program 110 measures electrical characteristics of the integrated circuit (step 302). In this embodiment, reliability program 110 measures leakage current through the integrated circuit gate once a voltage is applied. Reliability program 110 uses sensor circuit families 128 to detect the current. Subsequent to measuring electrical characteristics, reliability program 110 determines physical attributes of the integrated circuit (step 304). In this embodiment, reliability program 110 determines the gate EOT of each sensor location on semiconductor device 104. Reliability program 110 calculates the gate EOT by inserting the detected leakage current into an industry standard formula, known as quantum mechanical direct tunneling current density as a function of dielectric thickness at a fixed applied voltage. As will be known by one skilled in the art, the formula includes several technology-specific coefficients, as well as the area of the gate through which the leakage current is measured.

Subsequent to calculating the EOT, reliability program 110 models the failure rate for semiconductor device 104 (step 306). As mentioned previously, several different models exist for predicting reliability of an integrated circuit using the EOT. In one embodiment, reliability program 110 uses the Bias Temperature Instability (BTI) model, as known to one skilled in the art, to predict the failure rate of semiconductor device 104. In another embodiment, reliability program 110 uses the Time Dependent Dielectric Breakdown (TDDB) model, as known to one skilled in the art, to predict the failure rate of semiconductor device 104. In yet another embodiment, reliability program 110 uses the frequency degradation model, as known to one skilled in the art, to predict the failure rate of semiconductor device 104. In yet another embodiment, reliability program 110 may use a combination of one or more models to predict the failure rate of semiconductor device 104. Predicting reliability on a per chip basis significantly reduces the variability in the prediction results, enabling sorting of chips. For example, if a chip were predicted to have a longer life than others in the same lot, that chip could be used in a specific application that requires longer life. If, for example, a chip were predicted to have a shorter life than others in the same lot, that chip could be either used in a specific application that does not require a long life, or it could be discarded.

Figure 4:
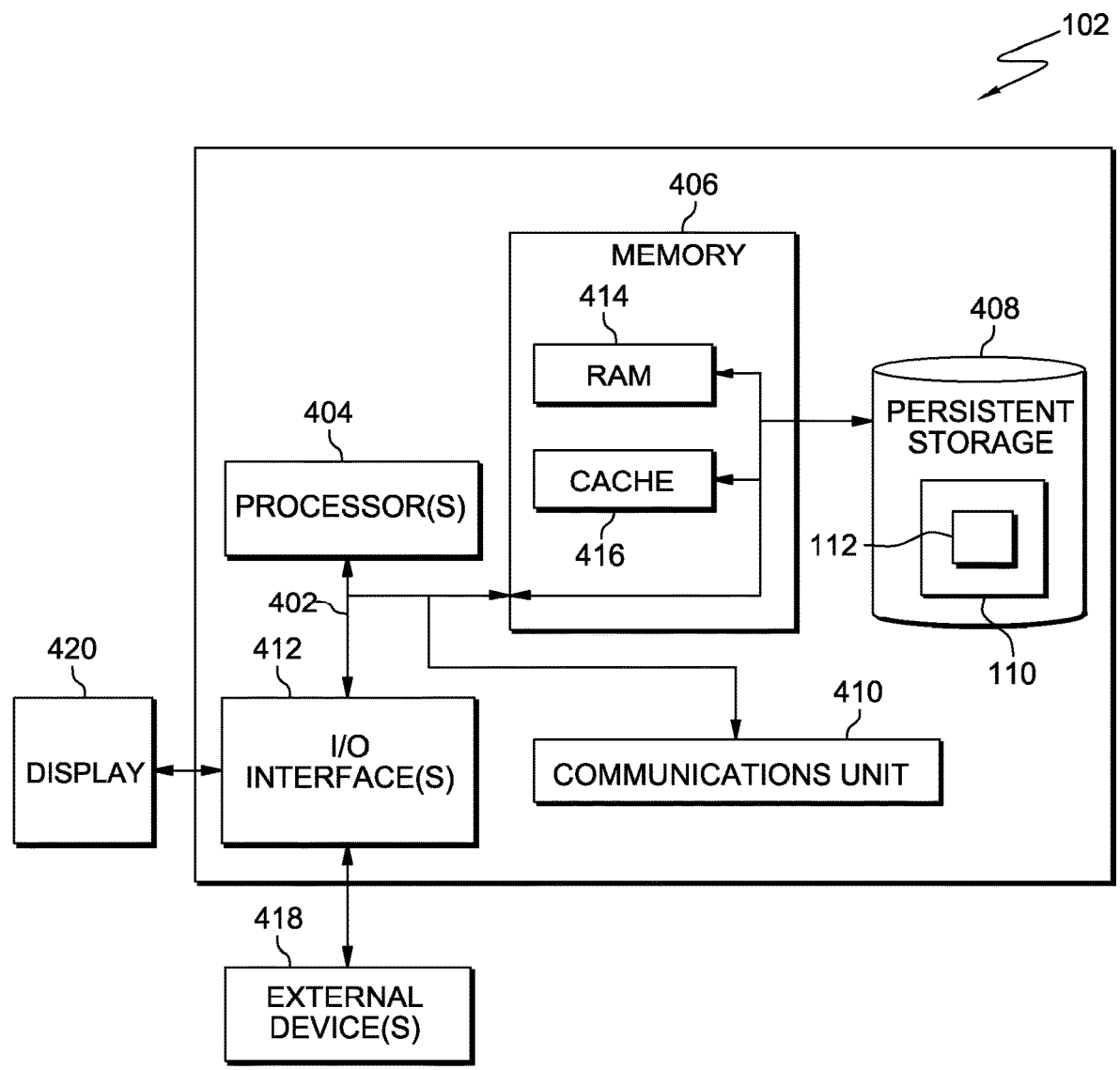
FIG. 4 depicts a block diagram of components of the computing device executing the reliability program, in accordance with an embodiment of the present invention.

FIG. 4 depicts a block diagram of components of computing device 102 in accordance with an illustrative embodiment of the present invention. It should be appreciated that FIG. 4 provides only an illustration of one implementation and does not imply any limitations with regard to the environments in which different embodiments may be implemented. Many modifications to the depicted environment may be made.

Computing device 102 includes communications fabric 402, which provides communications between computer processor(s) 404, memory 406, persistent storage 408, communications unit 410, and input/output (I/O) interface(s) 412. Communications fabric 402 can be implemented with any architecture designed for passing data and/or control information between processors (such as microprocessors, communications and network processors, etc.), system memory, peripheral devices, and any other hardware components within a system. For example, communications fabric 402 can be implemented with one or more buses.

Memory 406 and persistent storage 408 are computer-readable storage media. In a first embodiment, memory 406 includes random access memory (RAM) 414 and cache memory 416. In general, memory 406 can include any suitable volatile or non-volatile computer-readable storage media.

Reliability program 110 and database 112 are stored in persistent storage 408 for execution and/or access by one or more of the respective computer processors 404 via one or more memories of memory 406. In this embodiment, persistent storage 408 includes a magnetic hard disk drive. Alternatively, or in addition to a magnetic hard disk drive, persistent storage 408 can include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 408 may also be removable. For example, a removable hard drive may be used for persistent storage 408. Other examples include optical and magnetic disks, thumb drives, and smart cards that are inserted into a drive for transfer onto another computer-readable storage medium that is also part of persistent storage 408.

Communications unit 410, in these examples, provides for communications with other data processing systems or devices, including resources of semiconductor device 104 and tester 106. In these examples, communications unit 410 includes one or more network interface cards. Communications unit 410 may provide communications through the use of either or both physical and wireless communications links. Reliability program 110 and database 112 may be downloaded to persistent storage 408 through communications unit 410.

I/O interface(s) 412 allows for input and output of data with other devices that may be connected to computing device 102. For example, I/O interface 412 may provide a connection to external devices 418 such as a keyboard, keypad, a touch screen, and/or some other suitable input device. External devices 418 can also include portable computer-readable storage media such as, for example, thumb drives, portable optical or magnetic disks, and memory cards. Software and data used to practice embodiments of the present invention, e.g., reliability program 110 and database 112, can be stored on such portable computer-readable storage media and can be loaded onto persistent storage 408 via I/O interface(s) 412. I/O interface(s) 412 also connect to a display 420.

Display 420 provides a mechanism to display data to a user and may be, for example, a computer monitor.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Embodiments of the present invention may be used in a variety of electronic applications, including but not limited to advanced sensors, memory/data storage, semiconductors, microprocessors and other applications.

A resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Having described the preferred embodiment of creating integrated circuits that each include at least one per-chip EOT sensor (which are intended to be illustrative and not limiting), it is noted that modifications and variations may be made by persons skilled in the art in light of the above teachings.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later come to be known to those of ordinary skill in the art are expressly incorporated herein by reference and intended to be encompassed by the invention. It is therefore to be understood that changes may be made in the particular embodiments disclosed which are within the scope of the present invention as outlined by the appended claims.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer-readable medium(s) having computer readable program code/instructions embodied thereon.

Any combination of computer-readable media may be utilized. Computer-readable media may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of a computer-readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer-readable storage medium may be any tangible medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electromagnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device.

Program code embodied on a computer-readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java®, Smalltalk, C++ or the like and conventional procedural programming languages, such as the "C" programming language or similar programming languages. The program code may execute entirely on a user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

What is claimed is:

1. A method comprising:
   determining electrical characteristics of an integrated circuit by applying a voltage to a per-chip equivalent oxide thickness (EOT) sensor circuit, wherein the per-chip EOT sensor circuit measures and characterizes tunneling current density by device type as a function of physical oxide thickness;
   determining physical attributes of the integrated circuit based on the electrical characteristics; and
   modeling a predicted integrated circuit failure rate based on the physical attributes which includes calculating a gate EOT by inserting a detected leakage current into a model comprising area of a gate through which the leakage current is measured.

2. The method of claim 1, further comprising accessing EOT sensor circuit data stored in a database and using the EOT sensor circuit data to calculate an oxide thickness value of the integrated circuit.

3. The method of claim 2, wherein the EOT sensor circuit data stored in the database includes EOT sensor circuit data, manufacturing circuit data, application use conditions sensor circuit data, and a reliability model with product-specific confidence bounds.

4. The method of claim 3, wherein:
   the EOT sensor circuit data calculates an oxide thickness value that is used in reliability modeling;
   the manufacturing circuit data includes process variability data and defect density data collected during fabrication of a semiconductor device, which is used to adapt a reliability model with real-time, per-chip data;

the application use conditions sensor circuit data describes environmental conditions that a semiconductor device may be subjected to over the life of the device; and the reliability model with product-specific confidence bounds calculates an estimated failure rate, early life failure rate and intrinsic failure rate, based on per-chip EOT measurements.

5. The method of claim 4, wherein the application use conditions sensor circuit data include system ambient temperature and power on hours.

6. The method of claim 3, wherein the database includes screens and guard band data used to generate test limits for use by a tester.

7. The method of claim 6, wherein the screens and guard band data include data from a 3D part average test.

8. The method of claim 7, wherein requirements for the screens and guard band data are generated by translating quality and reliability requirements of a semiconductor device into test criteria.

9. The method of claim 1, further comprising detecting a resultant leakage current using the applied voltage.

10. The method of claim 1, wherein determining the electrical characteristics of the integrated circuit comprises utilizing Joint Test Action Group (JTAG) self-test functions embedded in the integrated circuit to apply the voltage to the per-chip EOT sensor circuit and to detect a resultant leakage current.

11. The method of claim 1, wherein determining the physical attributes comprises utilizing the determined electrical characteristics to calculate equivalent oxide thickness and wherein utilizing the determined electrical characteristics comprises inserting a detected value of leakage current into an algorithm for calculating the equivalent oxide thickness.

12. The method of claim 1, further comprising the steps of:

subsequent to qualification testing, reviewing test data to determine whether hardware tested passed or failed defined test criteria;

if the test hardware fails the defined test criteria, a computer analyzes failures for root cause and corrective actions are implemented;

if the test hardware passes the defined test criteria, the computer reviews reliability models to determine whether the test hardware and current and future manufacturing processes are consistent with expectations for production of the hardware.

13. The method of claim 12, further comprising the steps of:

subsequent to the test hardware passing the defined test criteria, the computer updates the reliability models;

if the reliability models require updating, the circuit and/or manufacturing process updates under change control are validated using a reliability monitor; and if the reliability models do not require updating, the production readiness phase begins, and a reliability program, which enables scaling for chip failure rate with improved confidence bounds, is executed.

14. The method of claim 13, wherein the modeling of the predicted integrated circuit failure rate comprises the steps of:

inserting the determined physical attributes in at least one of a plurality of reliability prediction algorithms; and calculating the predicted integrated circuit failure rate per chip included in a plurality of integrated circuit chips.

15. The method of claim 1, wherein the model comprises quantum mechanical direct tunneling current density as a function of dielectric thickness at a fixed applied voltage.

16. The method of claim 1, wherein the determining of the electrical characteristics comprises measuring and characterizing the electrical characteristics.

17. The method of claim 1, wherein the physical attributes are inserted into one or more reliability models, and the one or more models predict integrated circuit reliability based on per-chip EOT, manufacturing defect density, test screens and application conditions.

* * * * *